(12) United States Patent
Hsiao

(10) Patent No.: US 11,632,872 B2
(45) Date of Patent: Apr. 18, 2023

(54) SERVER ASSEMBLY

(71) Applicants: Inventec (Pudong) Technology Corporation, Shanghai (CN); INVENTEC CORPORATION, Taipei (TW)

(72) Inventor: Chi-Cheng Hsiao, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 86 days.

(21) Appl. No.: 17/346,483

(22) Filed: Jun. 14, 2021

(65) Prior Publication Data

US 2022/0295659 A1 Sep. 15, 2022

(30) Foreign Application Priority Data

Mar. 12, 2021 (CN) .......................... 202110269227.3

(51) Int. Cl.
| | |
|---|---|
| *H05K 7/14* | (2006.01) |
| *H05K 5/03* | (2006.01) |
| *H01M 50/209* | (2021.01) |
| *H01M 50/267* | (2021.01) |

(52) U.S. Cl.
CPC ............ *H05K 7/1487* (2013.01); *H05K 5/03* (2013.01); *H05K 7/1489* (2013.01); *H05K 7/1492* (2013.01); *H01M 50/209* (2021.01); *H01M 50/267* (2021.01)

(58) Field of Classification Search
CPC .. H01M 50/20; H01M 50/202; H01M 50/204; H01M 50/207; H01M 50/209; H01M 50/233; H01M 50/242; H01M 50/244; H01M 50/251; H01M 50/256; H01M 50/258; H01M 50/284; H01M 50/293; H01M 50/211; H01M 2220/10; H01M 10/6555; H01M 50/267; H05K 7/14; H05K 7/1432; H05K 7/1457; H05K 7/1487; H05K 7/1489; H05K 7/1492; H05K 5/03; G06F 1/16; G06F 1/263; G06F 1/30; G06F 1/181; G06F 1/187; G06F 1/188; Y02E 60/10; G11B 33/12
USPC ..................................................... 361/679.01
See application file for complete search history.

(56) References Cited

U.S. PATENT DOCUMENTS

| | | | | |
|---|---|---|---|---|
| 4,593,461 | A * | 6/1986 | Thiele ................. | H01M 50/213 429/100 |
| 5,278,730 | A * | 1/1994 | Kikinis ................ | H05K 5/0273 361/679.55 |
| 5,325,262 | A * | 6/1994 | Ma ........................ | G06F 1/1656 345/905 |
| 6,111,760 | A * | 8/2000 | Nixon .................. | H05K 5/0013 361/752 |
| 9,582,057 | B2 * | 2/2017 | Hartman .............. | G11B 33/128 |
| 9,829,936 | B1 * | 11/2017 | Rivera ................ | H01R 12/7017 |
| 2002/0067592 | A1 * | 6/2002 | Horiuchi .............. | G06F 1/1616 |

(Continued)

*Primary Examiner* — Adrian S Wilson
*Assistant Examiner* — Gage Crum
(74) *Attorney, Agent, or Firm* — Locke Lord LLP; Tim Tingkang Xia, Esq.

(57) ABSTRACT

A server assembly including a mounting frame, a battery box and a battery. The mounting frame includes an accommodation space configured to accommodate a disk drive. The battery box is disposed in the accommodation space of the mounting frame. The battery is installed in the battery box.

8 Claims, 5 Drawing Sheets

(56) References Cited

U.S. PATENT DOCUMENTS

2011/0175502 A1* 7/2011 Peng .................... G11B 33/124
                                                                           312/223.2
2014/0299737 A1* 10/2014 Okumura ............. H05K 7/1487
                                                                           248/636
2018/0337372 A1* 11/2018 Rivera ................ H01M 50/251

* cited by examiner

SERVER ASSEMBLY

CROSS-REFERENCE TO RELATED APPLICATIONS

This non-provisional application claims priority under 35 U.S.C. § 119(a) on Patent Application No(s). 202110269227.6 filed in China, on Mar. 12, 2021, the entire contents of which are hereby incorporated by reference.

BACKGROUND OF THE INVENTION

Technical Field of the Invention

The invention relates to a server assembly, more particularly a server assembly including a battery box.

Description of the Related Art

In general, a server includes disk drives storing a large amount of data. In order to maintain and change the disk drives in a convenient manner, the disk drives are removably disposed in a cage of the server respectively via mounting frames. Also, the quantity of the disk drives disposed in the cage can be adjusted according to actual requirements of the user.

However, since the mounting frame is configured for the installation of disk drives, other types of components are unable to be installed in the cage of the server via such mounting frames. Thus, there may be idle space in the cage when some of the disk drives are removed from the cage. In this way, the limited inner space of the server is not effectively utilized.

On the other hand, some types of servers include one or more built-in batteries, such that these built-in batteries can provide electricity when a power outage occurs. Thus, the data can still be stored in the disk drives instead of being lost during the power outage. However, current built-in batteries are accommodated in an exclusive space in the server chassis, such that the arrangements of other components in the inner space of the server chassis are limited, thereby adversely affecting the performance of the server.

SUMMARY OF THE INVENTION

The invention is to provide a server assembly which allows the battery box accommodating the battery to be installed in the idle space of the server assembly via the mounting frame for the disk drive, thereby increasing the space utilization of the server.

One embodiment of this invention provides a server assembly including a mounting frame, a battery box and a battery. The mounting frame includes an accommodation space configured to accommodate a disk drive. The battery box is disposed in the accommodation space of the mounting frame. The battery is installed in the battery box.

According to the server assembly disclosed by the above embodiment, the battery box accommodating the battery can be installed in the accommodation space of the mounting frame for disk drives, which allows the battery box accommodating the battery to be installed in the idle space of the server assembly via the mounting frame for the disk drive. In this way, the space utilization of the server is increased.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
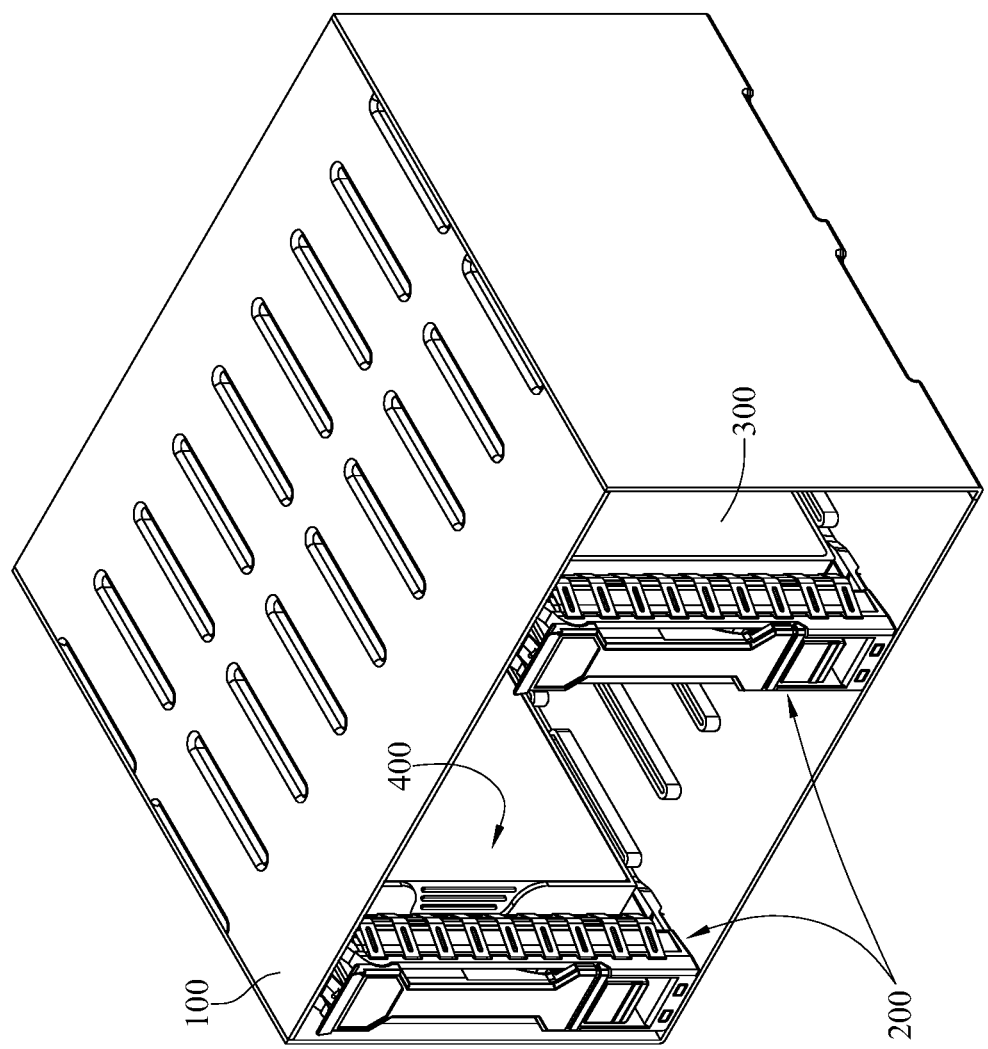
FIG. 1 is a perspective view of a server assembly according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
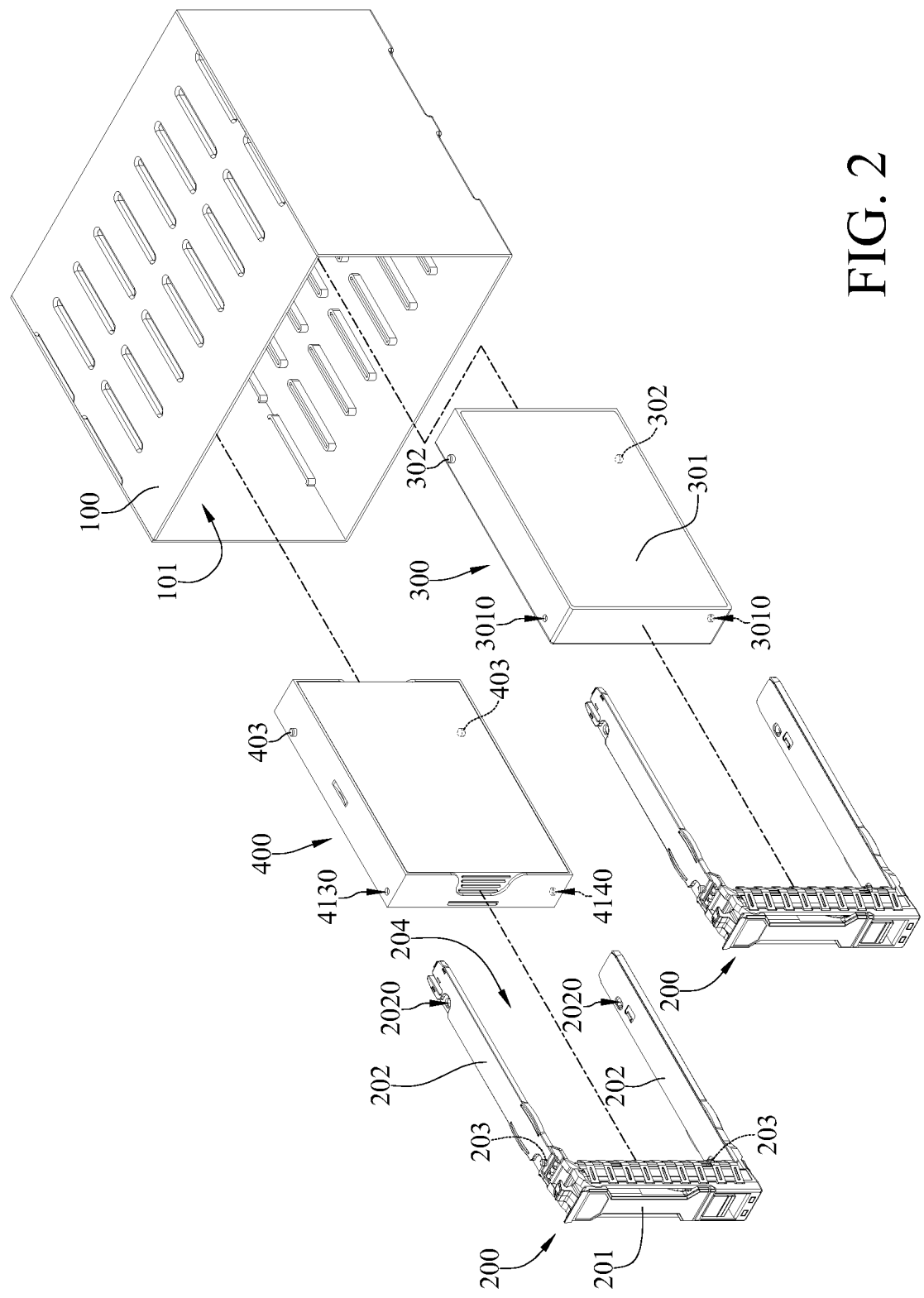
FIG. 2 is an exploded view of the server assembly in FIG. 1.
Figure 3:
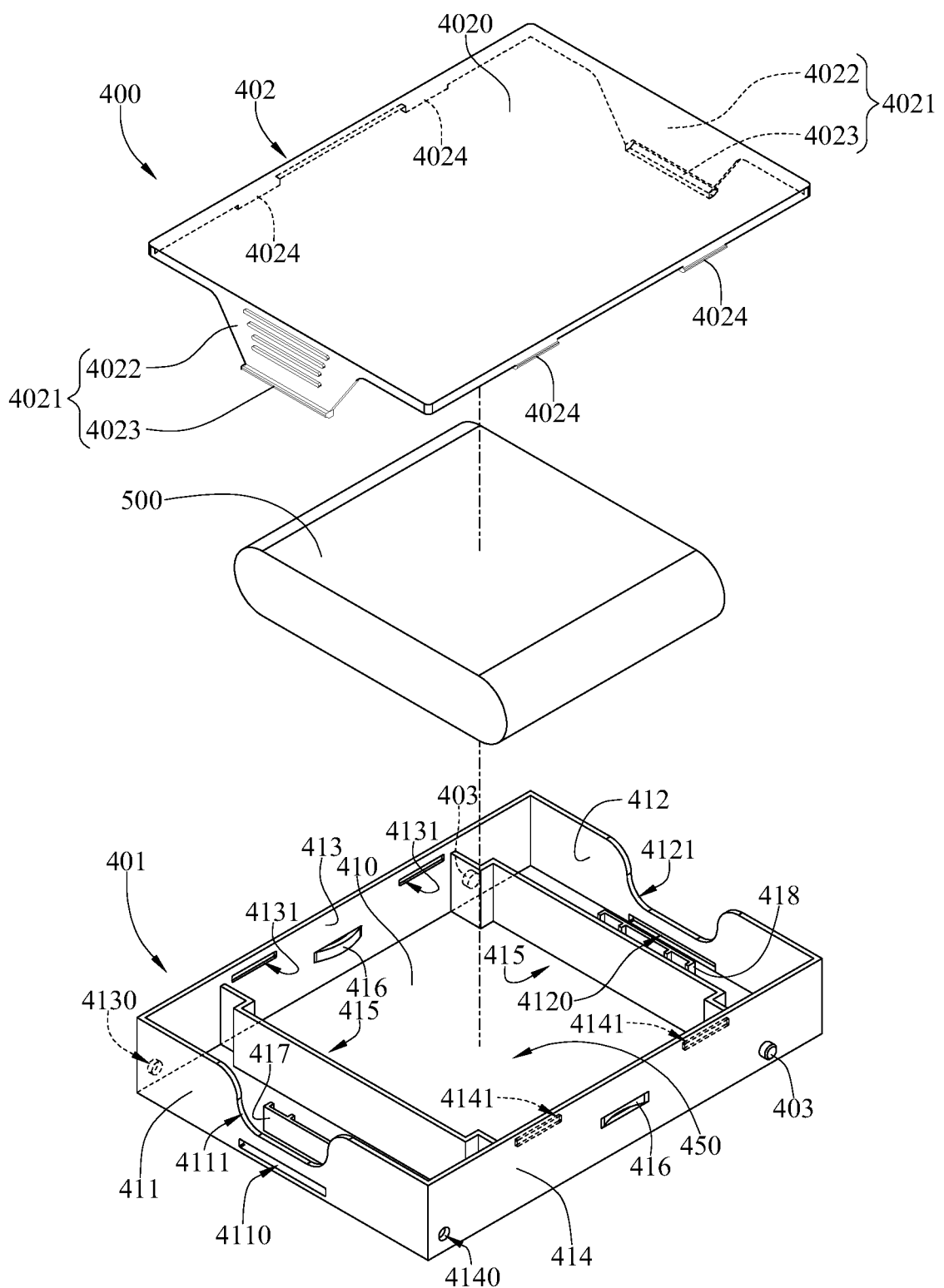
FIG. 3 is an exploded view of a battery box and a battery of the server assembly in FIG. 1.

Please refer to FIGS. 1 to 3, where FIG. 1 is a perspective view of a server assembly 10 according to an embodiment of the invention, FIG. 2 is an exploded view of the server assembly 10 in FIG. 1, and FIG. 3 is an exploded view of a battery box 400 and a battery 500 of the server assembly 10 in FIG. 1.

In this embodiment, the server assembly 10 includes a cage 100, two mounting frames 200, a storage unit 300, a battery box 400 and a battery 500. The mounting frames 200 are configured for installing disk drives, such as hard disk drives or solid-state drives.

The cage 100 includes a mounting space 101. In this embodiment, the two mounting frames 200 are arranged in the mounting space 101 of the cage 100. Each mounting frame 200 includes a front window 201, two side plates 202 and two first dowel pins 203. In each mounting frame 200, the two side plates 202 protrude from a side of the front window 201 and are spaced apart from each other, the front window 201 and the two side plates 202 together form an accommodation space 204 configured to accommodate a disk drive, the two first dowel pins 203 are respectively protrude from the two side plates 202 and are located between the two side plates 202, and each side plate 202 includes a first positioning hole 2020.

In this embodiment, the storage unit 300 includes a main body 301 and two dowel pins 302, and are, for example, small form factor (SFF) disk drives. The two dowel pins 302 respectively protrude from two opposite sides of the main body 301. The main body 301 includes two positioning holes 3010. The two dowel pins 302 are spaced apart from the two positioning holes 3010. The storage unit 300 is installed in the accommodation space 204 of one of the mounting frames 200. In detail, the two dowel pins 302 of the storage unit 300 are respectively fixed in the two first positioning holes 2020 of the two side plates 202 of one of the mounting frames 200, and two first dowel pins 203 of one of the mounting frames 200 are respectively fixed in the two positioning holes 3010 of the main body 301 of the storage unit 300.

In other embodiments, the server assembly may not include the cage 100, the storage unit 300 and the mounting frame 200 configured for the installation of the storage unit 300.

In this embodiment, the battery box 400 includes a base 401, a top cover 402 and two second dowel pins 403. In this embodiment, the base 401 includes a bottom plate 410, a first side plate 411, a second side plate 412, a third side plate 413, a fourth side plate 414, two partitions 415 and two cushioning plates 416.

The first side plate 411, the second side plate 412, the third side plate 413 and the fourth side plate 414 stand on the bottom plate 410. The first side plate 411 and the second side plate 412 are respectively located on two opposite sides of the bottom plate 410. The third side plate 413 and the fourth side plate 414 are respectively located on two opposite sides of the bottom plate 410 and are located between the first side plate 411 and the second side plate 412. In this embodiment, the first side plate 411 includes a first engagement hole 4110 and a first recess 4111 that are spaced apart from each other, and the second side plate 412 includes a second engagement hole 4120 and a second recess 4121 that are spaced apart from each other. In this embodiment, the third side plate 413 includes a second positioning hole 4130, and the fourth side plate 414 includes a second positioning hole 4140.

The two partitions 415 stand on the bottom plate 410 and are spaced apart from each other. Two opposite sides of each partition 415 are respectively connected to the third side plate 413 and the fourth side plate 414, and the two partitions 415 are located between the first side plate 411 and the second side plate 412. The two partitions 415, the third side plate 413 and the fourth side plate 414 together from a positioning space 450.

In this embodiment, each partition 415 includes a first restricting portion 4150, two connecting portions 4151 and two second restricting portions 4152. In each partition 415, two opposite sides of the first restricting portion 4150 are respectively connected to the two connecting portions 4151, the two second restricting portions 4152 are connected to the two first restricting portions 4150 respectively via the two connecting portions 4151, and the two second restricting portions 4152 are respectively connected to the third side plate 413 and the fourth side plate 414. The two first restricting portions 4150 of two partitions 415 are spaced apart from each other by a first distance D1. One of the second restricting portions 4152 of one of the partitions 415 and one of the second restricting portions 4152 of the other partition 415 are adjacent to each other and are spaced apart from each other by a second distance D2. In this embodiment, the first distance D1 is greater than the second distance D2 so that the positioning space 450 includes a first positioning space 451 and a second positioning space 452 that are different in sizes. The four second restricting portions 4152 of the two partitions 415, the third side plate 413 and the fourth side plate 414 together form a first positioning space 451, and the two first restricting portions 4150 and the four connecting portions 4151 of the two partitions 415 together form a second positioning space 452. The first positioning space 451 and the second positioning space 452 intersect with each other. That is, a part of the first positioning space 451 is overlapped with a part of the second position space 452.

In other embodiment, the first distance between the two first restricting portions of the two partitions may be equal to or smaller than the second distance between the two adjacent second restricting portions. That is, in other embodiments, the positioning space may not include two spaces that are different in sizes. In still other embodiments, the base of the battery box may not include the partition and the positioning space may be formed by the first side plate, the second side plate, the third side plate and the fourth side plate.

The two cushioning plates 416 are respectively protrude from the third side plate 413 and the fourth side plate 414, and are located in the first positioning space 451 of the positioning space 450.

Note that, in other embodiments, the base of the battery box may not include the cushioning plates 416, and one or more sponges that are functioned as cushion may be attached on an inner surface of the third side plate and an inner surface of the fourth side plate.

In this embodiment, the top cover 402 includes a cover body 4020 and two engagement structures 4021. In this embodiment, each engagement structure 4021 includes an elastic arm 4022 and an engaging protrusion 4023. The two elastic arms 4022 are respectively protrude from two opposite sides of the cover body 4020, and are respectively located in the first recess 4111 of the first side plate 411 and the second recess 4121 of the second side plate 412. The two engaging protrusions 4023 respectively protrude from sides of the two elastic arms 4022 that are located away from the cover body 4020, and are respectively and removably engaged with the first engagement hole 4110 of the first side plate 411 and the second engagement hole 4120 of the second side plate 412. The cover body 4020 is located on sides of the first side plate 411, the second side plate 412, the third side plate 413 and the fourth side plate 414 that are located away from the bottom plate 410.

In this embodiment, since the two elastic arms 4022 are respectively located in the first recess 4111 of the first side plate 411 and the second recess 4121 of the second side plate 412, the two elastic arms 4022 can be easily accessed from outside so as to be pushed to remove the engaging protrusions 4023 from the first engagement hole 4110 and the second engagement holes 4120. However, in other embodiments, the first side plate may not include the first recess 4111, the second side plate may not include the second recess 4121, and the operations of the two elastic arms may be facilitated by decreasing heights of the first side plate and the second side plate relative to the bottom plate.

In this embodiment, the two second dowel pins 403 are respectively protrude outward from the third side plate 413 and the fourth side plate 414 of the base 401. The battery box 400 is installed in the accommodation space 204 of the other mounting frame 200. In detail, the two first dowel pins 203 of the other mounting frame 200 are respectively fixed in the second positioning hole 4130 of the third side plate 413 and the second positioning hole 4140 of the fourth side plate 414, and the two second dowel pins 403 of the battery box 400 are respectively fixed in the two first positioning holes 2020 of the other mounting frame 200.

Note that the invention is not limited to how the battery box and the other mounting frame are fixed to each other. In other embodiments, the battery box and the other mounting frame may be fixed to each other via screwing.

In this embodiment, the base 401 further includes a first restricting plate 417 and a second restricting plate 418. The first restricting plate 417 stands on the bottom plate 410, and is located between the first side plate 411 and the partition 415 adjacent to the first side plate 411, thereby restricting the moving range of one of the engagement structures 4021. The second restricting plate 418 stands on the bottom plate 410, and is located between the second side plate 412 and the other partition 415 adjacent to the second side plate 412, thereby restricting the moving range of the other engagement structure 4021. That is, the first restricting plate 417 and the second restricting plate 418 can respectively stop the movements of the two elastic arms 4022 of the engagement structures 4021, such that the first restricting plate 417 and the second restricting plate 418 can prevent the two elastic arms 4022 of the two engagement structures 4021 from being cracked due to excessive deformation of the two elastic arms 4022.

In other embodiments, the base may not include the first restricting plate 417 and the second restricting plate 418.

In this embodiment, the top cover 402 further includes a plurality of engagement components 4024, the third side plate 413 further includes a plurality of engagement holes 4131, and the fourth side plate 414 further includes a plurality of engagement holes 4141. The engagement components 4024 protrude from the cover body 4021 and are respectively engaged with the engagement holes 4131 and 4141. In other embodiments, the top cover may not include the engagement components 4024, the fourth side plate may not include the engagement holes 4131, and the fourth side plate may not include the engagement holes 4141.

In addition, in this embodiment, a size of the battery box 400 is substantially equal to a size of the storage unit 300, but the invention is not limited thereto. In other embodiments, the size of the battery box may be different from the size of the storage unit.

Figure 4:
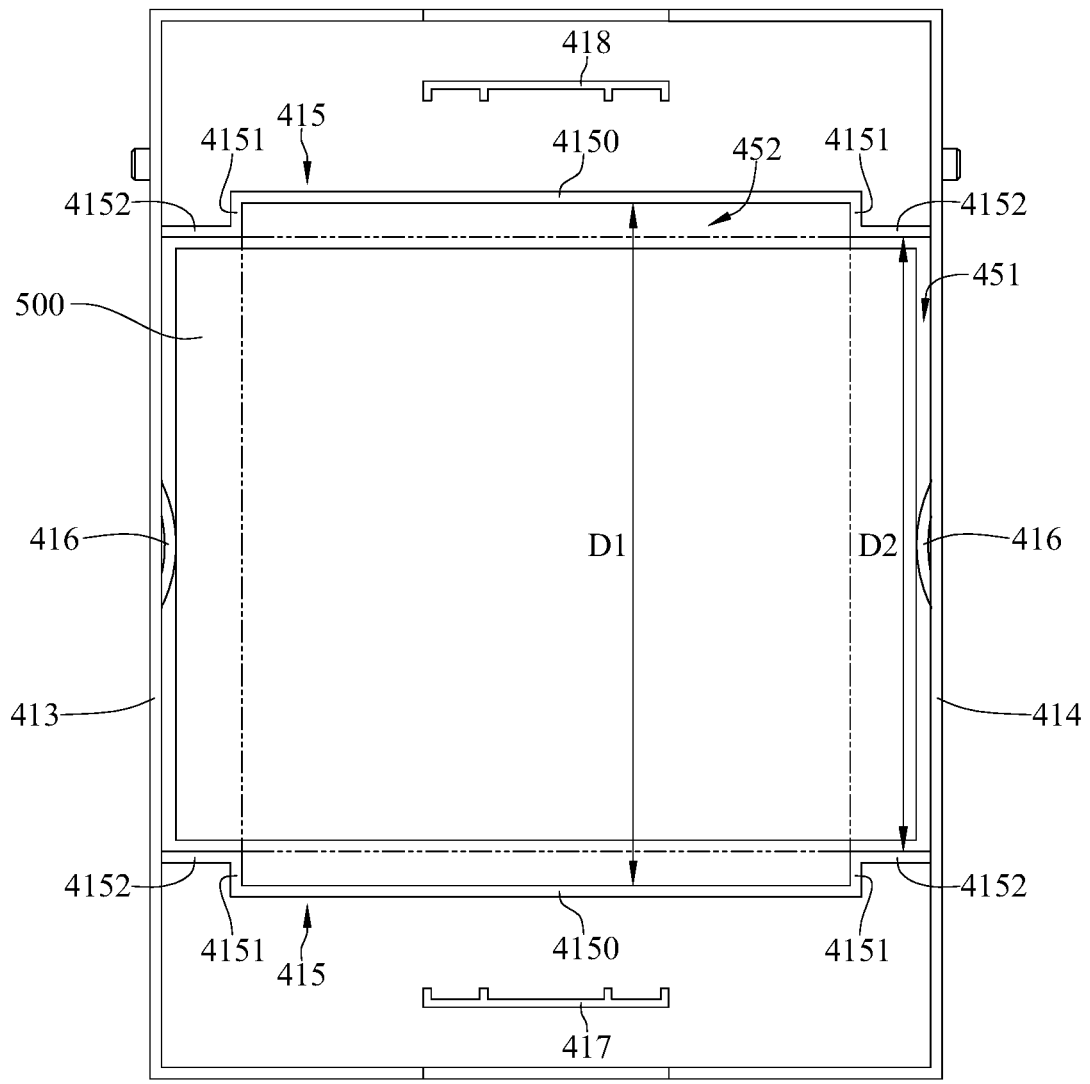
FIG. 4 is a top view showing that the battery is installed in a first positioning space of the battery box in FIG. 3 with a top cover of the battery box being omitted.

Please refer to FIGS. 3 and 4, where FIG. 4 is a top view showing that the battery 500 is installed in a first positioning space 451 of the battery box 400 in FIG. 3 with the top cover 402 of the battery box 400 being omitted. In this embodiment, the battery 500 is installed in the first positioning space 451 of the battery box 400 and is restricted by the four second restricting portions 4152 of the two partitions 415, the third side plate 413 and the fourth side plate 414. In addition, the cover body 4020 is located on a side of the battery 500 that is located away from the bottom plate 410. Moreover, two opposite sides of the battery 500 respectively rest on the two cushioning plates 416.

In other embodiments, the battery box may not include the top cover and the battery is prevented from being detached from the battery box merely via the restriction of the base.

In some embodiments, a metal coating may be created on an outer surface of the top cover 402 via electroplating, thereby reducing the electromagnetic interference created by the battery 500.

Figure 5:
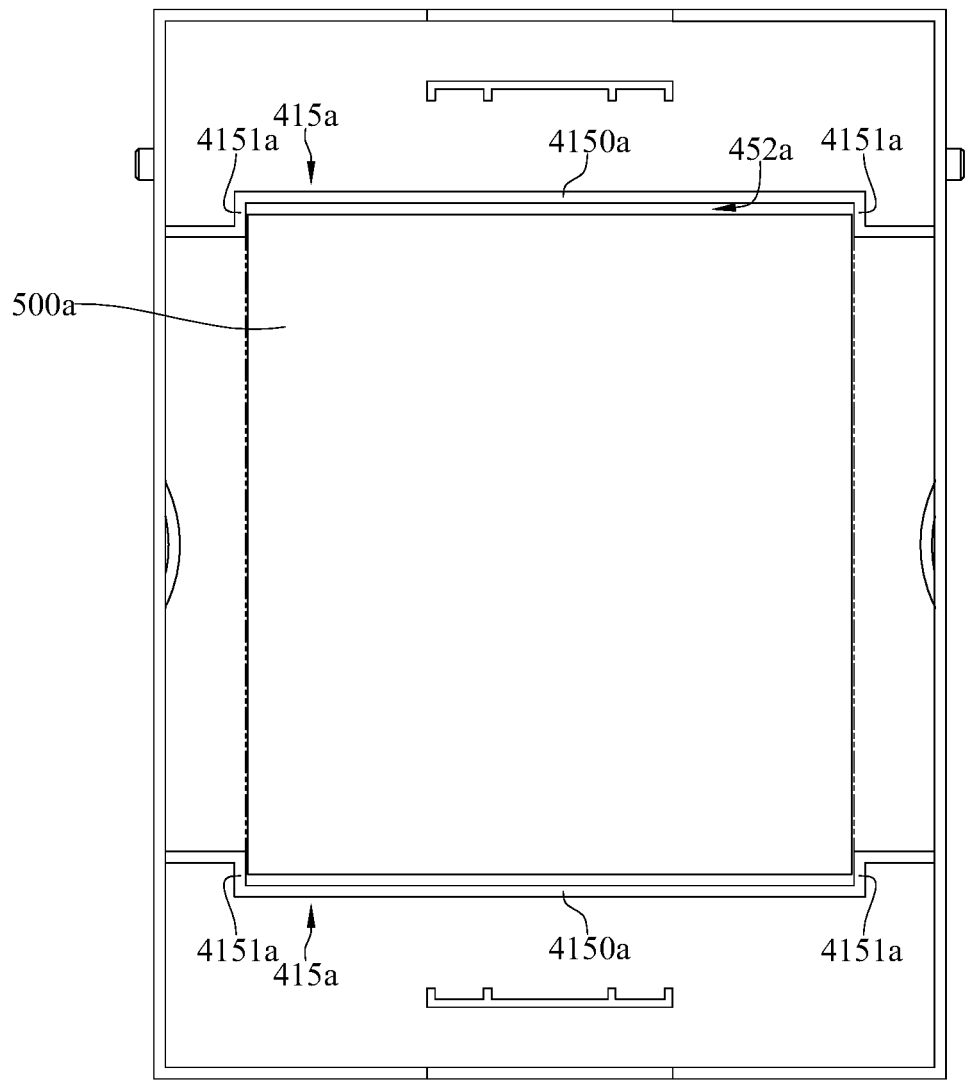
FIG. 5 is a top view showing that a battery according to another embodiment of the invention is installed in a second positioning space of a battery box with a top cover of the battery box being omitted.

The battery box according to the invention is not limited to be merely suitable for accommodating one size of the battery. Please refer to FIG. 5, where FIG. 5 is a top view showing that a battery 500a according to another embodiment of the invention is installed in a second positioning space 452a of a battery box with a top cover of the battery box being omitted. In this embodiment, a size of the battery 500a is different from the size of the battery 500 shown in FIG. 4. The battery 500a is installed in the second positioning space 452a and is restricted by the two first restricting portions 4150a and the four connecting portions 4151a of the two partitions 415a.

According to the server assembly disclosed by the above embodiments, the battery box accommodating the battery can be installed in the accommodation space of the mounting frame for disk drives, which allows the battery box accommodating the battery to be installed in the idle space of the server assembly via the mounting frame for the disk drive. In this way, the space utilization of the server is increased.

In addition, since the first distance between the two first restricting portions of the two partitions is larger than the second distance between adjacent two second restricting portions, the positioning space of the battery box includes the first positioning space and the second positioning space that are different in sizes. Accordingly, the battery box can be configured for installing different sizes of batteries.

In an embodiment, the server including the built-in battery disclosed by the invention can operate in a stable manner without being interrupted and thus can be applied to artificial intelligence (AI) computing, edge computing and can be used as 5G server, cloud computing server, or internet of vehicle server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server assembly, comprising:
   a mounting frame, comprising an accommodation space configured to accommodate a disk drive;
   a battery box, disposed in the accommodation space of the mounting frame; and
   a battery, installed in the battery box;
   wherein the battery box comprises a bottom plate, a first side plate, a second side plate, a third side plate, a fourth side plate and two partitions, the first side plate, the second side plate, the third side plate and the fourth side plate stand on the bottom plate, the first side plate and the second side plate are respectively located on two opposite sides of the bottom plate, the third side plate and the fourth side plate are respectively located on two opposite sides of the bottom plate, the third side plate and the fourth side plate are located between the first side plate and the second side plate, the two partitions stand on the bottom plate and are spaced apart from each other, two opposite sides of each of the two partitions are respectively connected to the third side plate and the fourth side plate, the two partitions are located between the first side plate and the second side plate, the two partitions, the third side plate and the fourth side plate together form a positioning space, and the battery is installed in the positioning space;
   wherein the two partitions each comprise a first restricting portion, two connecting portions and two second restricting portions;
   wherein in each of the two partition, two opposite sides of the first restricting portion are respectively connected to the two connecting portions, the two second restricting portions are connected to the first restricting portion respectively via the two connecting portions, the two second restricting portions are respectively connected to the third side plate and the fourth side plate; and
   wherein the two first restricting portions of the two partitions are spaced apart from each other by a first distance, one of the two second restricting portions of one of the two partitions and one of the two second restricting portions of another one of the two partitions are adjacent to each other and are spaced apart from each other by a second distance, the first distance is greater than the second distance, the positioning space comprises a first positioning space and a second positioning space that are different in sizes, the four second restricting portions of the two partitions, the third side plate and the fourth side plate together form the first positioning space, the two first restricting portions and the four connecting portions of the two partitions together form the second positioning space, and the battery is installed in the first positioning space or the second positioning space.

2. The server assembly according to claim 1, wherein the battery box further comprises two cushioning plates, the two cushioning plates respectively protrude from the third side plate and the fourth side plate and are located in the positioning space, when the battery is fixed in the first positioning space of the positioning space, two opposite sides of the battery respectively rest on the two cushioning plates.

3. The server assembly according to claim 1, wherein the battery box comprises a base and a top cover, the base comprises the bottom plate, the first side plate, the second side plate, the third side plate, the fourth side plate and the two partitions, the first side plate comprises a first engagement hole, the second side plate comprises a second engagement hole, the top cover comprises a cover body and two engagement structures, the two engagement structures respectively protrude from two opposite sides of the cover body, the two engagement structures are respectively and removably engaged with the first engagement hole and the second engagement hole, and the cover body is located on a side of the battery that is located away from the bottom plate.

4. The server assembly according to claim 3, wherein the base further comprises a first restricting plate and a second restricting plate, the first restricting plate stands on the bottom plate and is located between the first side plate and one of the two partitions that is adjacent to the first side plate so as to restrict a moving range of one of the two engagement structures, the second restricting plate stands on the bottom plate and is located between the second side plate and another one of the two partitions that is adjacent to the second side plate so as to restrict a moving range of another one of the two engagement structures.

5. The server assembly according to claim 3, wherein the two engagement structures each comprise an elastic arm and an engaging protrusion, the two elastic arms respectively protrude from two opposite sides of the cover body, the two engaging protrusions respectively protrude from sides of the two elastic arm that are located away from the cover body, the two engaging protrusions are respectively and removably engaged with the first engagement hole and the second engagement hole, the first side plate further comprises a first recess spaced apart from the first engagement hole, the second side plate further comprises a second recess spaced apart from the second engagement hole, and the two elastic arms are respectively located in the first recess and the second recess.

6. The server assembly according to claim 1, wherein the mounting frame comprises a front window, two side plates and two first dowel pins, the two side plates of the mounting frame protrude from a side of the front window and are spaced apart from each other, the front window and the two side plates of the mounting frame together form the accommodation space, the two first dowel pins respectively protrude from the two side plates of the mounting frame and are located between the two side plates of the mounting frame, the two side plates of the mounting frame each comprise a first positioning hole, the battery box comprises a base and two second dowel pins, the two second dowel pins respectively protrude outward from two opposite sides of the base, the base comprises two second positioning holes, the two second positioning holes are respectively located on two opposite sides of the base, the two first dowel pins of the mounting frame are respectively fixed in the two second positioning holes of the battery box, and the two second dowel pins of the battery box are respectively fixed in the two first positioning holes of the mounting frame.

7. The server assembly according to claim 1, further comprising a cage and a storage unit, wherein the mounting frame include two mounting frames, the cage comprises a mounting space, the storage unit and the battery box are respectively installed in the two accommodation spaces of the two mounting frames, and the two mounting frames are arranged in the mounting space of the cage.

8. The server assembly according to claim 7, wherein a size of the battery box is substantially equal to a size of the storage unit.

* * * * *